(12) United States Patent
Lim

(10) Patent No.: US 6,611,009 B2
(45) Date of Patent: Aug. 26, 2003

(54) CROSS-COUPLED TRANSISTOR PAIR

(75) Inventor: Kyu-Nam Lim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/008,705

(22) Filed: Dec. 6, 2001

(65) Prior Publication Data

US 2002/0079516 A1 Jun. 27, 2002

(30) Foreign Application Priority Data

Dec. 22, 2000 (KR) ............................. 2000-80426

(51) Int. Cl.[7] .................................................. H01L 29/73
(52) U.S. Cl. .................... 257/208; 257/202; 257/394; 257/206
(58) Field of Search ........................... 257/208, 202, 257/394, 206, 903, 906

(56) References Cited

U.S. PATENT DOCUMENTS 5,341,013 A  *  8/1994  Koyanagi et al. ........... 257/368
6,297,668 B1 * 10/2001  Schober ...................... 326/101
6,323,526 B1 * 11/2001  Saitou et al. ................ 257/401
6,404,019 B1 *  6/2002  Reith et al. .................. 257/368

* cited by examiner

Primary Examiner—Tom Thomas
Assistant Examiner—Thomas Magee
(74) Attorney, Agent, or Firm—Marger Johnson & McCollom, P.C.

(57) ABSTRACT

A cross-coupled transistor pair includes separately arranged first and second active areas. A gate area of a first transistor is arranged symmetrically on portions of the first and second active areas. A gate area of a second transistor is also arranged symmetrically on portions of the first and second active areas. A first signal line extends between drain areas of the first transistor and the gate area of the second transistor. A second signal line extends between drain areas of the second transistor and the gate area of the first transistor. Metal lines can be provided to connect a source voltage, data signal lines, or control signals to common source areas of the first and second transistors. Methods for constructing cross-coupled transistor pairs are also provided.

14 Claims, 14 Drawing Sheets

BP3  BP4

M3

NM12A1

NM12A2

CROSS-COUPLED TRANSISTOR PAIR

This application claims priority from Korean Patent Application No. 2000-80426, filed Dec. 22, 2000, the contents of which are hereby incorporated by reference in their entirety.

BACKGROUND OF THE INVENTION

1. Field of the Invention

The present invention relates to cross-coupled transistor pairs and methods of constructing cross-coupled transistor pairs.

2. Description of Related Art

In conventional cross-coupled transistor pair layouts, significant differences may exist between the length of a line connecting a gate of a first transistor to a node of the second transistor and the length of a line connecting a gate of the second transistor to a node of the first transistor. As a result, a gate loading and a junction loading of the two transistors forming the cross-coupled transistor pair may differ from each other. When differences occur between the gate loading and the junction loading of the transistors, the cross-coupled transistor pair may not operate as desired.

FIG. 1 is a circuit diagram illustrating a conventional cross-coupled transistor pair configuration. The cross-coupled transistor pair includes a first PMOS transistor PM1 and a second PMOS transistor PM2. The first PMOS transistor PM1 includes a source that receives a power supply voltage VCC, a drain connected to a node "a", and a gate connected to a node "b". The second PMOS transistor PM2 includes a source that receives the power supply voltage VCC, a drain connected to the node "b", and a gate connected to the node "a".

Operation of the cross-coupled transistor pair of FIG. 1 is as follows. If a voltage of the node "a" has a logic "high" level and a voltage of the node "b" has a logic "low" level, the first PMOS transistor PM1 is turned on and the power supply voltage VCC is applied to the node "a". The second transistor PM2 is thereby turned off. Alternatively, if a voltage of the node "a" has a logic "low" level and a voltage of the node "b" has a logic "high" level, the second PMOS transistor PM2 is turned on and the power supply voltage VCC is applied to the node "b". The first PMOS transistor PM1 is thereby turned off. The cross-coupled transistor pair of FIG. 1 therefore acts as a latch to latch levels of the nodes "a" and "b".

FIGS. 2A to 2D are plan views schematically illustrating a conventional method of constructing the cross-coupled transistor pair of FIG. 1. Referring to FIG. 2A, separate first and second active areas PM1A, PM2A, corresponding to the first and second PMOS transistors PM1, PM2, respectively, are arranged on a substrate (not shown).

As shown in FIG. 2B, a first gate area PM1G is then arranged longitudinally on a portion of the first active area PM1A between a first source area PM1S and a first drain area PM1D. A second gate area PM2G is longitudinally arranged on a portion of the second active area PM2A between a second source area PM2S and a second drain area PM2D. A terminal of the first gate area PM1G extends perpendicularly to the right of the first active area PM1A to connect to the second drain area PM2D. A terminal of the second gate area PM2G extends perpendicularly to the left of the second active area PM2A to connect to first the drain area PM1D. The first and second gate areas PM1G, PM2G are indicated by cross-hatching.

Subsequently, as shown in FIG. 2C, first and second metal lines PM1M1, PM2M1 are arranged longitudinally on the first and second source areas PM1S, PM2S, respectively, to receive the power supply voltage VCC. Third and fourth metal lines PM1M2, PM2M2 are longitudinally arranged on the first and second drain areas PM1D, PM2D to connect to the second and first gate areas PM2G, PM1G, respectively. The first and second gate areas PM1G, PM2G correspond to the first and second PMOS transistors PM1, PM2, respectively. The first through fourth metal lines PM1M1, PM2M1, PM1M2, PM2M2 are indicated by reverse cross-hatching.

Referring to FIG. 2D, contacts CON1 connect the first and second metal lines PM1M1, PM2M1 to the first and second source areas PM1S, PM2S. Contacts CON1 also connect the third and fourth metal lines PM1M2, PM2M2 to the first and second drain areas PM1D, PM2D, and connect the first and second gate areas PM1G, PM2G to the fourth and third metal lines PM2M2, PM1M2, respectively. Unfortunately, the distance from the node "a" to a position "c" on the second gate area PM2G is different than the distance from the node "b" to a position "d" on the first gate area PM1G. As a result, the cross-coupled transistor pair may not operate as designed.

FIG. 3 is a circuit diagram schematically illustrating another conventional cross-coupled transistor pair configuration. Referring to FIG. 3, a cross-coupled transistor pair according to this configuration includes first and second PMOS transistors PM3, PM4. The first PMOS transistor PM3 has a source connected to a data input/output (I/O) line DIO, a gate connected to a node "f", and a drain connected to a node "e". The second PMOS transistor PM4 includes a source connected to an inverted data I/O line DIOB, a gate connected to the node "e", and a drain connected to the node "f". This cross-coupled transistor pair arrangement provides a current sense amplifier for a data I/O line pair DIO, DIOB of a semiconductor memory device.

FIGS. 4A to 4E are plan views schematically illustrating a method of constructing the cross-coupled transistor pair of FIG. 3, according to the prior art. Referring first to FIG. 4A, first and second active areas PM3A, PM4A, corresponding to the first and second transistors PM3, PM4, respectively, are separately arranged on a substrate (not shown). Referring to FIG. 4B, a first gate area PM3G is longitudinally arranged on a portion of the first active area PM3A between a first source area PM3S and a first drain area PM3D. A second gate area PM4G is longitudinally arranged on a portion of the second active area PM4A between a second source area PM4S and a second drain area PM4D. A terminal of the first gate area PM3G extends perpendicularly to the left of the first active area PM3A to connect to the second drain area PM4D. A terminal of the second gate area PM4G extends perpendicularly to the right of the second active area PM4A to connect to the first drain area PM3D. The first and second gate areas PM3G, PM4G are indicated using cross-hatching.

As shown in FIG. 4C, a first signal line BP1 is arranged outside the active areas in a transverse direction to provide a connection between the first drain area PM3D, corresponding to the first PMOS transistor PM3, and the second gate area PM4G, corresponding to the second PMOS transistor PM4. A second signal line BP2 is also arranged transversely outside the active areas to provide a connection between the second drain area PM4D, corresponding to the second PMOS transistor PM4, and the first gate area PM3G, corresponding to the first PMOS transistor PM3.

Next, as shown in FIG. 4D, first and second metal lines PM3M1, PM4M1, corresponding to the data I/O line pair DIO, DIOB (see FIG. 3), are arranged longitudinally on the first and second source areas PM3S, PM4S, respectively. Third and fourth metal lines PM3M2, PM4M2 are arranged longitudinally on respective ones of the first and second drain areas PM3D, PM4D to connect them to the first and second signal lines BP1, BP2, respectively. Fifth and sixth metal lines M1, M2 are arranged outside the first and second active areas PM3A, PM4A to connect the first and second signal lines BP1, BP2 to the second and first gate areas PM4G, PM3G, respectively.

Finally, as shown in FIG. 4E, contacts CON2 are arranged to connect the first and second metal lines PM3M1, PM4M1 to the first and second source areas PM3S, PM4S, respectively. Contacts CON2 further connect the third and fourth metal lines PM3M2, PM4M2 to the first and second drain areas PM3D, PM4D, respectively; the third and fourth metal lines PM3M2, PM4M2 to the first and second signal lines BP1, BP2, respectively; the fifth and sixth metal lines M1, M2 to the first and second gate areas PM3G, PM4G, respectively; and the fifth and sixth metal lines M1, M2 to the second and first signal lines BP2, BP1, respectively.

In the cross-coupled transistor pair layout of FIGS. 4A to 4E, a line length from node "e" to a terminal "g" on the gate area PM4G of the second PMOS transistor PM4 is equal to that of a line length from node "f" to a terminal "h" on the gate area PM3G of the first PMOS transistor PM3. Accordingly, there is no difference between the gate loading and the junction loading of the first PMOS transistor PM3 and the second PMOS transistor PM4, and the cross-coupled transistor pair operates as designed.

Unfortunately, however, since the fifth and sixth metal lines M1, M2 are arranged outside the first and second active areas PM3A, PM4A, the cross-coupled transistor pair layout of FIGS. 4A to 4E has an increased layout size. An increase in layout size leads to an increase in a total size of a semiconductor memory device.

FIG. 5 is a circuit diagram illustrating yet another conventional cross-coupled transistor pair configuration. The cross-coupled transistor pair of FIG. 5 includes first and second NMOS transistors NM1, NM2. The first NMOS transistor NM1 includes a drain connected to a bit line BL, a gate connected to a node "j", and a source to which a control signal LAB is applied. The second NMOS transistor NM2 includes a drain connected to an inverted bit line BLB, a gate connected to a node "i", and a source to which the control signal LAB is applied. The cross-coupled transistor pair of FIG. 5 can be used as an NMOS bit line sense amplifier, connected between a bit line pair BL, BLB of a semiconductor memory device.

FIGS. 6A to 6E are plan views schematically illustrating a conventional layout method for constructing the cross-coupled transistor pair of FIG. 5. First, referring to FIG. 6A, an active area NMA is arranged on a substrate (not shown). Referring next to FIG. 6B, a first gate area NM1G is arranged on an upper portion of the active area NMA between a first drain area NM1D and a common source area NMS. A second gate area NM2G is arranged on a lower portion of the active area NMA between a second drain area NM2D and the common source area NMS.

The first drain area NM1D corresponds to the first NMOS transistor NM1 and is separated from the common source area NMS by the first gate area NM1G. The first gate area NM1G has an approximately letter "U" shape of a predetermined thickness. The second drain area NM2D corresponds to the second NMOS transistor NM2 and is separated from the common source area NMS by a second gate area NM2G. The second gate area NM2G has an inverted letter "U" shape of a predetermined thickness.

Referring to FIG. 6C, first and second signal lines BP3, BP4 are arranged longitudinally on the common source area NMS on a left side of the first gate area NM1G and a right side of a second gate area NM2G, respectively. The first and second signal lines BP3, BP4 transmit data from the bit line pair BL, BLB. The first signal line BP3 connects the first drain area NM1D, corresponding to the first NMOS transistor NM1, with the second gate area NM2G, corresponding to the second NMOS transistor NM2. The second signal line BP4 connects the first gate area NM1G, corresponding to the first NMOS transistor NM1, with the second drain area NM2D, corresponding to the second NMOS transistor NM2.

Referring now to FIG. 6D, a first metal line M3 is arranged transversely on a portion of the common source area NMS between the first and second gate areas NM1G, NM2G to transmit a control signal LAB. Finally, as shown in FIG. 6E, contacts CON3 are arranged to connect the first signal line BP3 to the first drain area NM1D and the second gate area NM2G. Contacts CON3 also connect the second signal line BP4 to the first gate area NM1G and the second drain area NM2D. A contact also connects the metal line M3 to the common source area NMS.

In the conventional cross-coupled transistor pair layout shown in FIGS. 6A to 6E, a difference occurs between the distance from the node "i" to the second gate area NM2G and the distance from the node "j" to the first gate area NM1G. Since these different distances may cause the first and second NMOS transistors NM1, NM2 to experience a difference between the gate loading and the junction loading thereof, this conventional cross-coupled transistor pair layout may not operate as designed.

As described above, conventional layout methods for cross-coupled transistor pairs may not operate as designed because of differences between gate loading and junction loading of the transistors. Furthermore, in the conventional cross-coupled transistor pair layout methods, a threshold voltage of the two transistors depends on a density of impurities implanted into the gate area. However, since the two transistors are generally spaced apart from and parallel to each other, a density of the impurities implanted into the gate areas varies from one gate area to the other. Using the conventional layout method, a threshold voltage difference may therefore occur between the two transistors that constitute the cross-coupled transistor pair, and the cross-coupled transistor pair will not operate as designed.

SUMMARY OF THE INVENTION

Various embodiments of the present invention provide cross-coupled transistor pair layouts that perform a stable and reliable operation.

According to a preferred embodiment of the present invention a cross-coupled transistor pair includes separately arranged first and second active areas. A gate area of a first transistor is arranged symmetrically on portions of the first and second active areas. A gate area of a second transistor is also arranged symmetrically on portions of the first and second active areas. A first signal line extends between drain areas of the first transistor and the gate area of the second transistor. A second signal line extends between drain areas of the second transistor and the gate area of the first transistor. Metal lines can be provided to connect a source voltage, data signal lines, or control signals to common source areas of the first and second transistors. Methods for constructing cross-coupled transistor pairs are also provided.

BRIEF DESCRIPTION OF THE DRAWINGS

A more complete understanding of the present invention and the advantages thereof can be obtained through the following detailed description of preferred embodiments made with reference to the accompanying drawings, in which like reference numerals denote like parts, and in which.

DETAILED DESCRIPTION OF PREFERRED EMBODIMENTS

Figure 1:
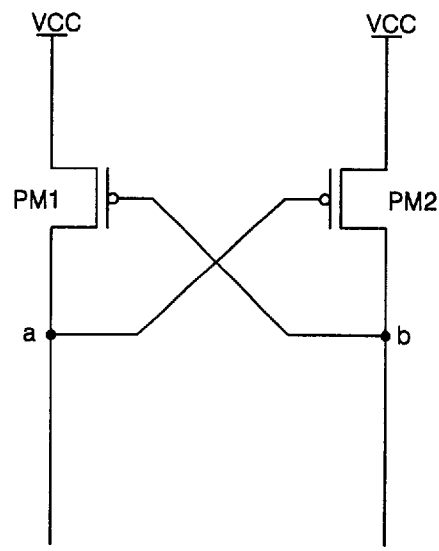
FIG. 1 is a schematic circuit diagram illustrating a conventional cross-coupled transistor pair.
Figure 2A:
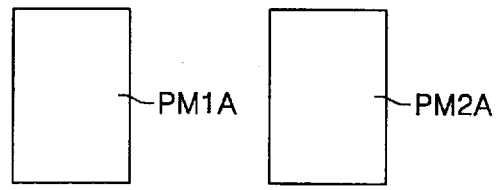
FIGS. 2A to 2D are plan views schematically illustrating a method of constructing the cross-coupled transistor pair of FIG. 1, according to the prior art.
Figure 2B:
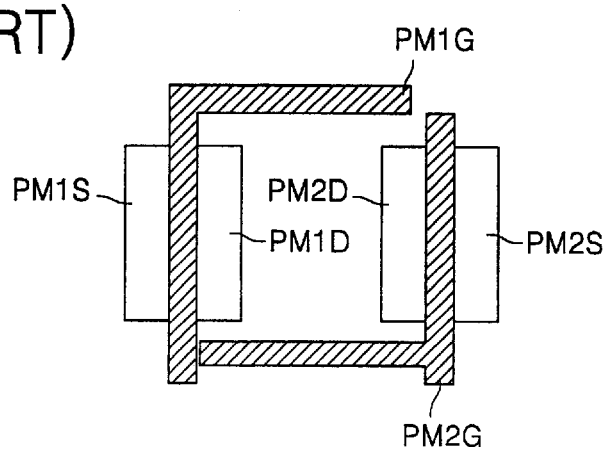
Figure 2C:
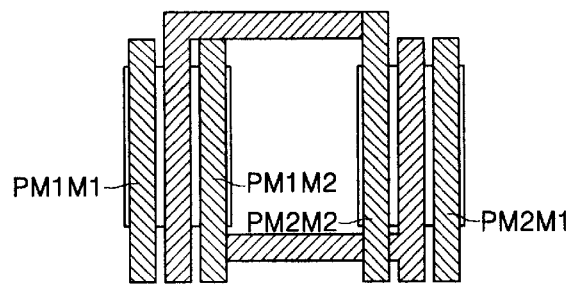
Figure 2D:
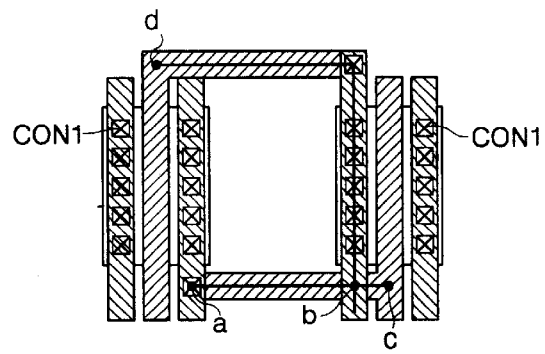

Reference will now be made in detail to various preferred embodiments of the present invention, examples of which are illustrated in the accompanying drawings. For instance, FIGS. 7A to 7D are plan views schematically illustrating a method of forming the cross-coupled transistor pair of FIG. 1, according to a first preferred embodiment of the present invention.

Figure 7A:
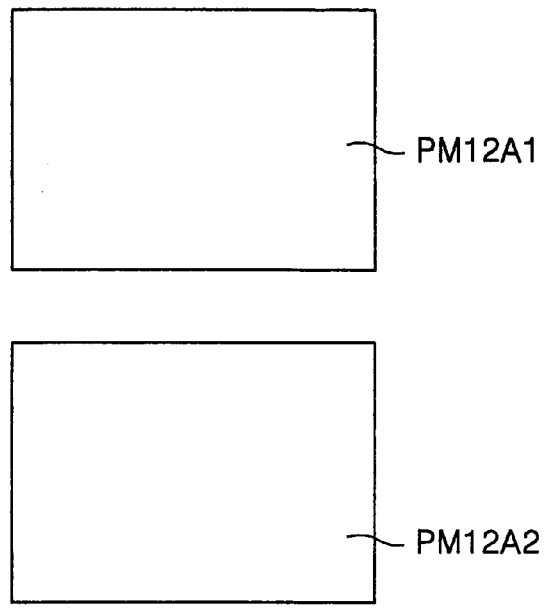
FIGS. 7A to 7D are plan views schematically illustrating a method of forming the cross-coupled transistor pair of FIG. 1, according to a first preferred embodiment of the present invention.
Figure 7B:
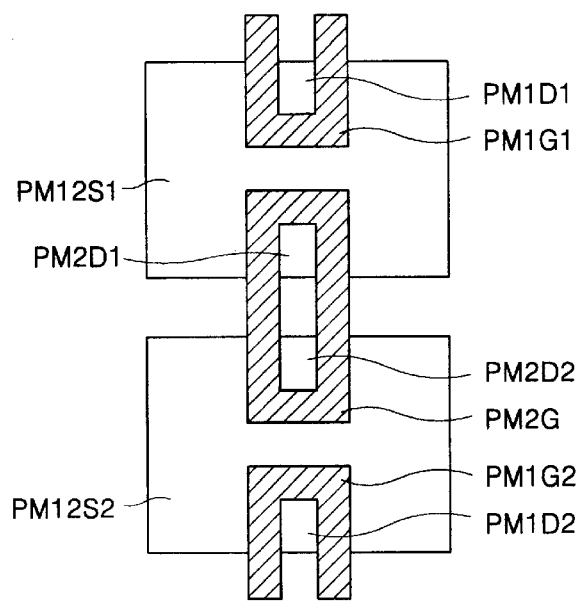

Referring to FIG. 7A, first and second active areas PM12A1, PM12A2 are separately arranged on upper and lower portions of a substrate (not shown). Referring to FIG. 7B, a first gate area PM1G1 has a letter "U" shape and is arranged on an upper portion of the first active area PM12A1, between a first drain area PM1D1 and a first common source area PM12S1. A second gate area PM1G2 has an inverted letter "U" shape and is arranged on a lower portion of the second active area PM12A2 between a second drain area PM1D2 and a second common source area PM12S2. The first and second gate areas PM1G1, PM1G2 and first and second drain areas PM1D1, PM1D2 all correspond to a first PMOS transistor PM1 (see FIG. 1).

A third gate area PM2G has a substantially rectangular shape having the same thickness as the first and second gate areas PM1G1, PM1G2 and is arranged both on a lower portion of the first active area PM12A1, between a third drain area PM2D1 and the first common source area PM12S1, and on an upper portion of the second active area PM12A2, between a fourth drain area PM2D2 and the second common source area PM12S2. The third gate area PM2G and third and fourth drain areas PM2D1, PM2D2 all correspond to a second PMOS transistor PM2 (see FIG. 1).

Although the first and second gate areas PM1G1, PM1G2 preferably have a letter "U" shape, the gate areas PM1G1, PM1G2 may have other shapes capable of isolating the drain area from the source area. For example, the first and second gate areas PM1G1, PM1G2 may have a semicircular shape. Similarly, although the third gate area PM2G preferably has a rectangular shape, other shapes may also be implemented. The third gate PM2G may, for instance, have a circular shape.

Figure 7C:
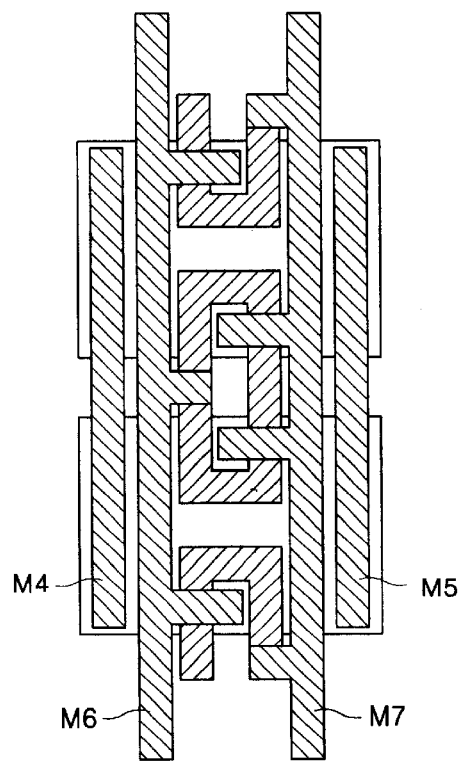

Referring to FIG. 7C, first and second metal lines M4, M5 are arranged on a left side of the first and second common source areas PM12S1, PM12S2 and a right side of the first and second common source areas PM12S1, PM12S2, respectively. The first and second metal lines M4, M5 connect the common source areas PM12S1, PM12S2 to the power supply voltage VCC (see FIG. 1). A third metal line M6 is arranged between the first metal line M4 and the gate areas PM1G1, PM1G2, PM2G to connect the first and second drain areas PM1D1, PM1D2, corresponding to the first PMOS transistor PM1, to the third gate area PM2G, which corresponds to the second PMOS transistor PM2. A fourth metal line M7 is arranged between the second metal line M5 and the gate areas PM1G1, PM1G2, PM2G to connect the first and second gate areas PM1G1, PM1G2, corresponding to the first PMOS transistor PM1, with the third and fourth drain areas PM2D1, PM2D2, corresponding to the second PMOS transistor PM2.

Figure 7D:
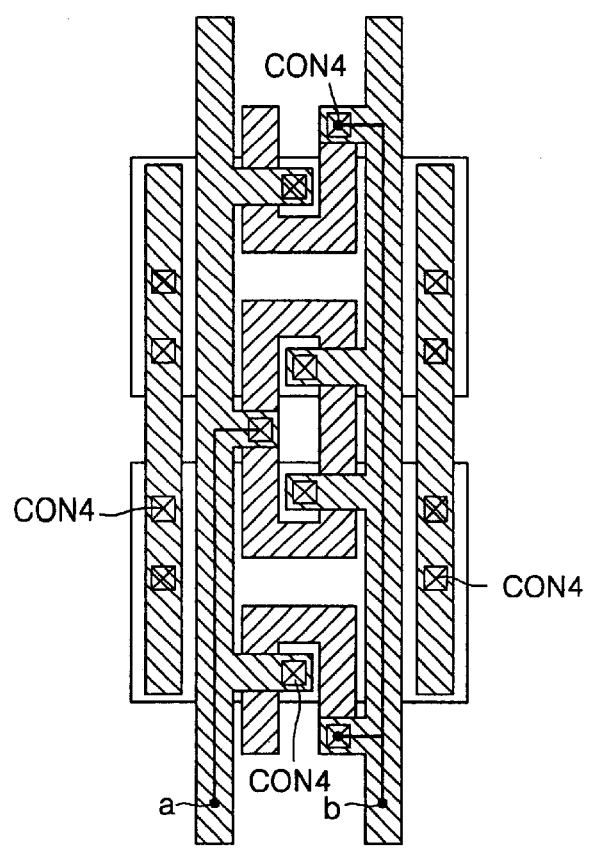

Finally, as shown in FIG. 7D, contacts CON4 are arranged to connect the first metal line M4 to the first and second common source areas PM12S1, PM12S2. Contacts CON4 also connect the second metal line M5 to the first and second common source areas PM12S1, PM12S2. Similarly, the third metal line M6 is connected to the third gate area PM2G and the first and second drain areas PM1D1, PM1D2; and the fourth metal line M7 is connected to the first and second gate areas PM1G1, PM1G2 and to the third and fourth drain areas PM2D1, PM2D2.

As shown, a distance from a node "a" to the third gate area PM2G, of the second PMOS transistor PM2, is equal to an average distance between a node "b" and the first and second gate areas PM1G1, PM1G2, of the first PMOS transistor PM1. As a result, the gate loading and the junction loading of the two transistors PM1, PM2 of the cross-coupled transistor pair are equal. The cross-coupled transistor pair will therefore operate as designed. In addition, compared with the conventional layout method of FIGS. 2A to 2D, the layout method of FIGS. 7A to 7D results in a cross-coupled transistor pair having a relatively small layout area.

Figure 3:
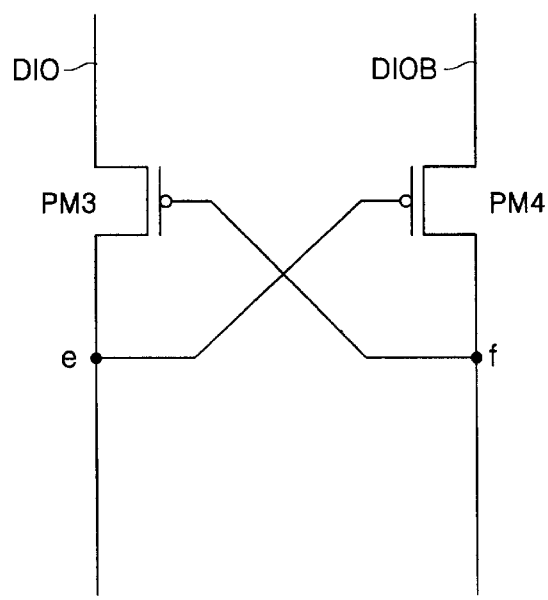
FIG. 3 is a schematic circuit diagram illustrating another conventional cross-coupled transistor pair.
Figure 4A:
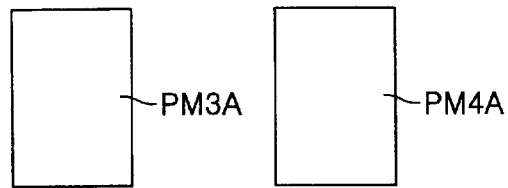
FIGS. 4A to 4E are plan views schematically illustrating a method of constructing the cross-coupled transistor pair of FIG. 3, according to the prior art.
Figure 4B:
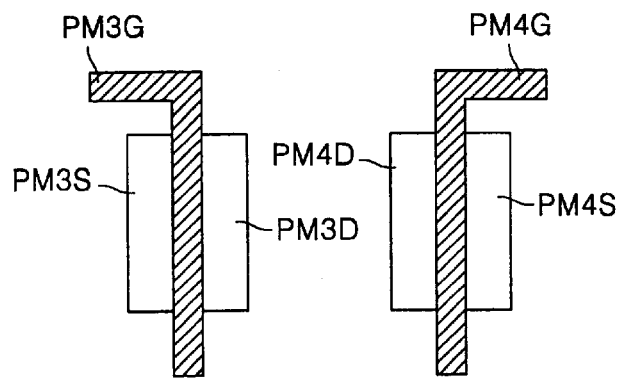
Figure 4C:
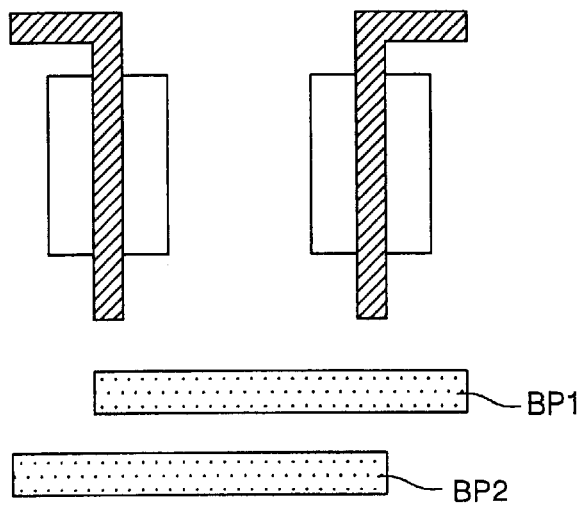
Figure 4D:
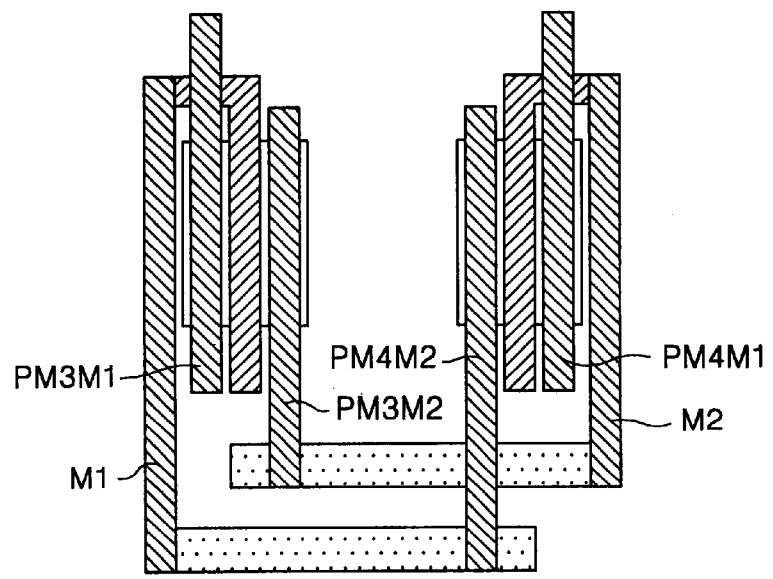
Figure 4E:
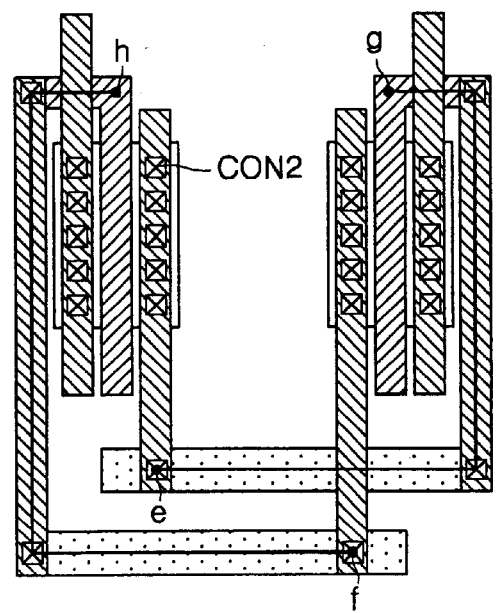
Figure 8A:
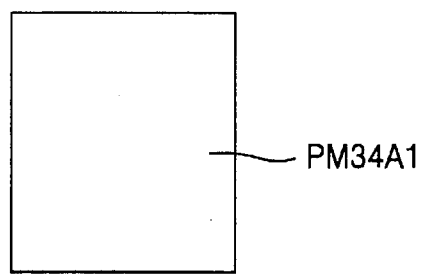
FIGS. 8A to 8E are plan views schematically illustrating a method of forming the cross-coupled transistor pair of FIG. 3, according to a second preferred embodiment of the present invention.
Figure 8A:
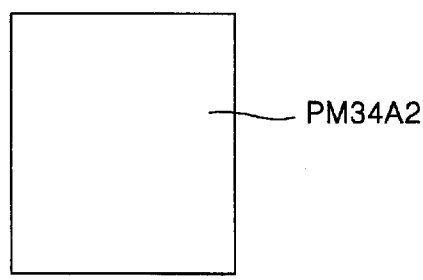
Figure 8B:
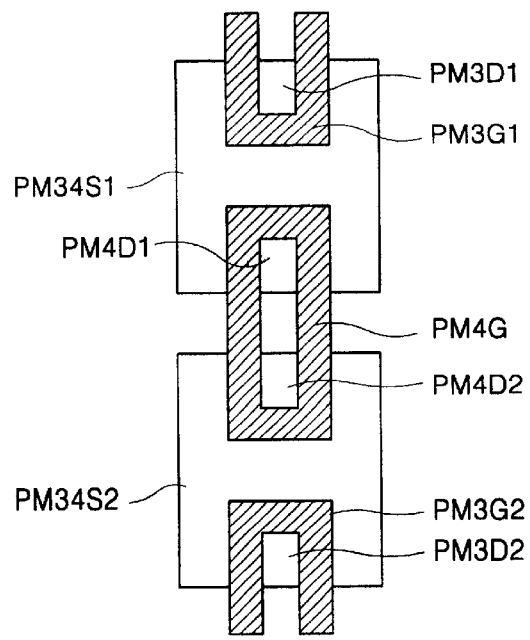

FIGS. 8A to 8E are plan views schematically illustrating a method of constructing the cross-coupled transistor pair of FIG. 3 according to a second preferred embodiment of the present invention. Referring to FIG. 8A, first and second active areas PM34A1, PM34A2 are separately arranged on upper and lower portions of a substrate (not shown). As shown in FIG. 8B, first, second, and third gate areas PM3G1, PM3G2, PM4G are arranged on the first and second active areas PM34A1, PM34A2 in the same manner as the first, second, and third gate areas PM1G1, PM1G3, PM2G of the first preferred embodiment, shown in FIG. 7B. As before, the first and second gate areas PM3G1, PM3G2 correspond to the first transistor PM3 (see FIG. 3). Likewise, the third gate area PM4G corresponds to the second transistor PM4 (see FIG. 3).

Figure 8C:
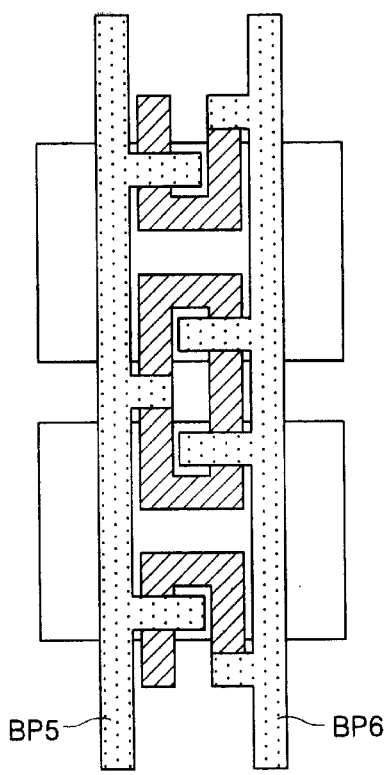

As shown in FIG. 8C, a first signal line BP5 is longitudinally arranged on first and second common source areas PM34S1, PM34S2 on a left side of the gate areas PM3G1, PM3G2, PM4G to connect the third gate area PM4G, corresponding to the second PMOS transistor PM4, with the first and second drain areas PM3D1, PM3D2, corresponding to the first PMOS transistor PM3. A second signal line BP6 is longitudinally arranged on the common source areas PM34S1, PM34S2 on a right side of the gate areas PM3G1, PM3G2, PM4G to connect the first and second gate areas PM34G1, PM34G2, corresponding to the first PMOS transistor PM3, with the third and fourth drain areas PM4D1, PM4D2, corresponding to the second PMOS transistor PM4.

Figure 8E:
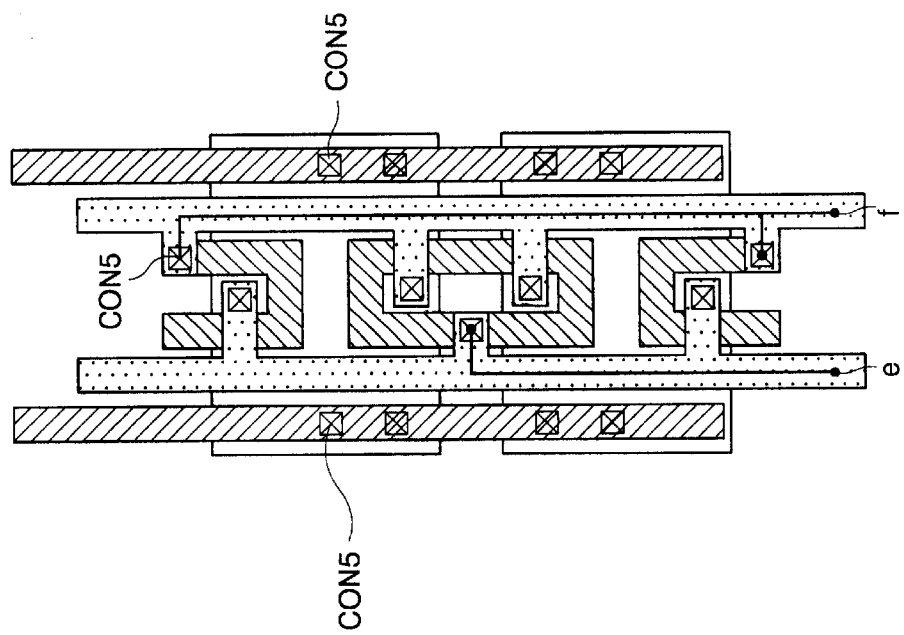
Figure 8D:
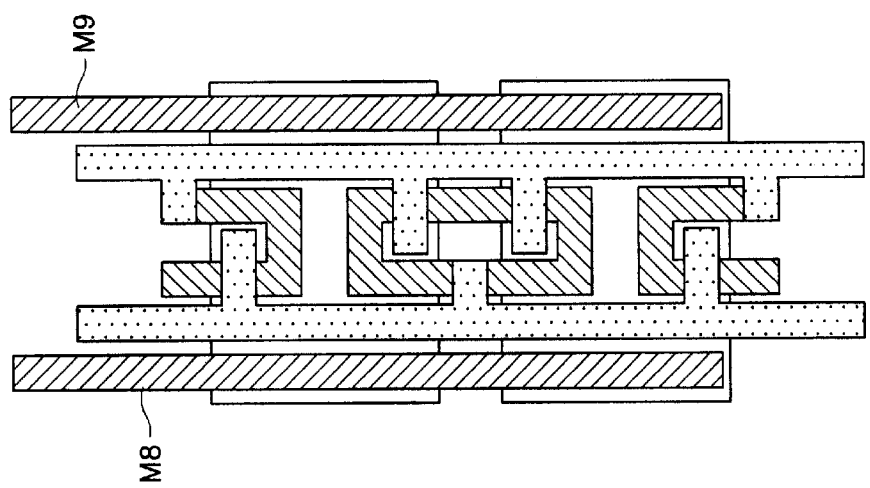

Referring to FIG. 8D, first and second metal lines M8, M9 are arranged on portions of the common source areas PM34S1, PM34S2 outside the signal lines BP5, BP6, respectively. The metal lines M8, M9 receive data from the data I/O line pair DIO, DIOB. Finally, as shown in FIG. 8E, contacts CON5 are arranged to connect the first metal line M8 to the first and second common source areas PM34S1, PM34S2. Contacts CON5 also connect the first signal line BP5 to the third gate area PM4G and to the first and second drain areas PM3D1, PM3D2. The second metal line M9 is connected to the common source areas PM34S1, PM34S2, and the second signal line BP6 is connected to the first and second gate areas PM3G1, PM3G2 and to the third and fourth drain areas PM4D1, PM4D2, also through contacts CON5.

As shown in FIG. 8E, a distance from a node "e" to the third gate area PM4G, of the second PMOS transistor PM4, is equal to an average distance from a node "f" to the first and second gate areas PM3G1, PM3G2, of the first PMOS transistor PM3. As a result, the gate loading and the junction loading of the two transistors PM3, PM4 forming the cross-coupled transistor pair in this embodiment are equal and therefore operate as designed. In addition, compared with the cross-coupled transistor pair layout shown in FIGS. 4A to 4E, the layout of FIGS. 8A to 8E has a relatively small layout area.

Figure 5:
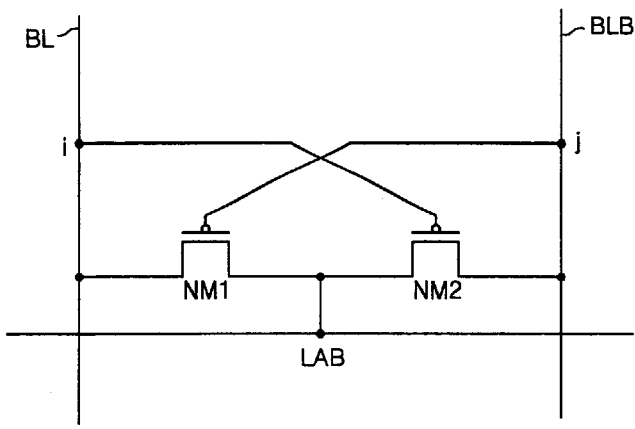
FIG. 5 is a schematic circuit diagram illustrating yet another conventional cross-coupled transistor pair.
Figure 6A:
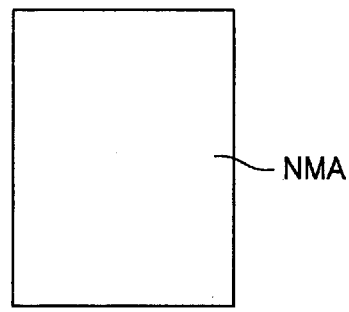
FIGS. 6A to 6E are plan views schematically illustrating a method of constructing the cross-coupled transistor pair of FIG. 5, according to the prior art.
Figure 6B:
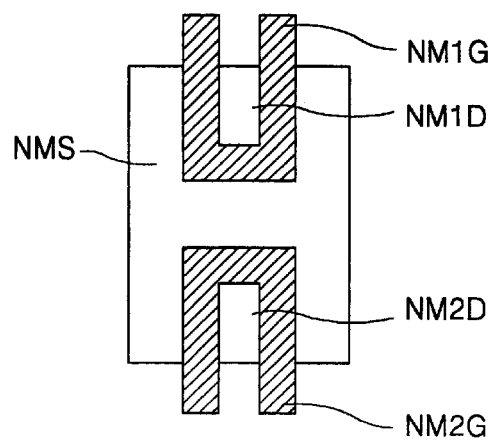
Figure 6C:
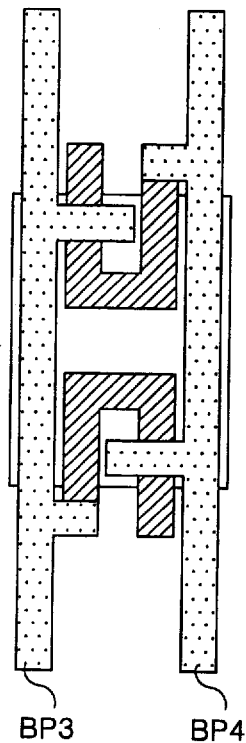
Figure 6D:
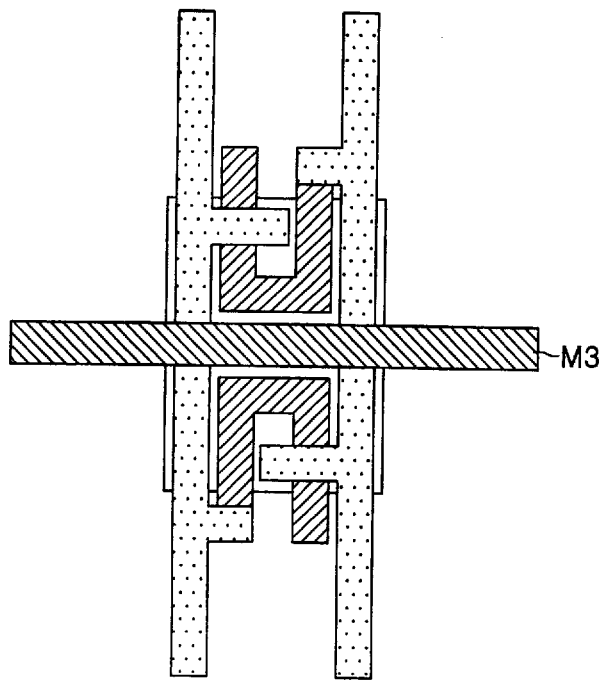
Figure 6E:
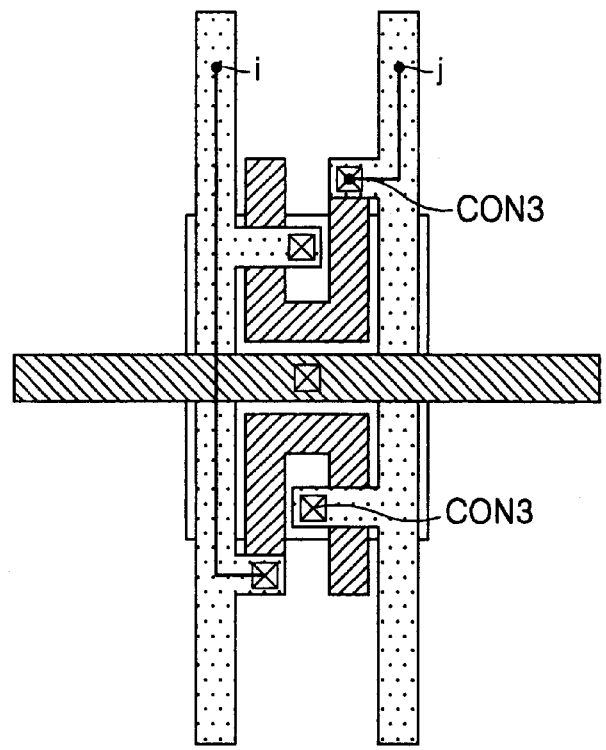
Figure 9A:
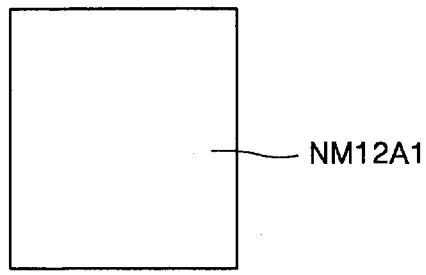
FIGS. 9A to 9E are plan views schematically illustrating a method of forming the cross-coupled transistor pair of FIG. 5, according to a third preferred embodiment of the present invention.
Figure 9A:
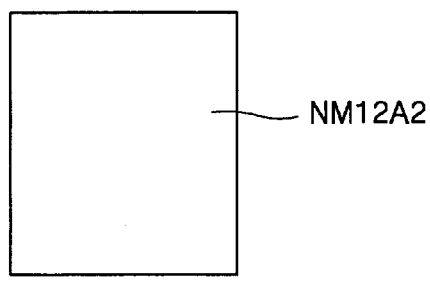
Figure 9B:
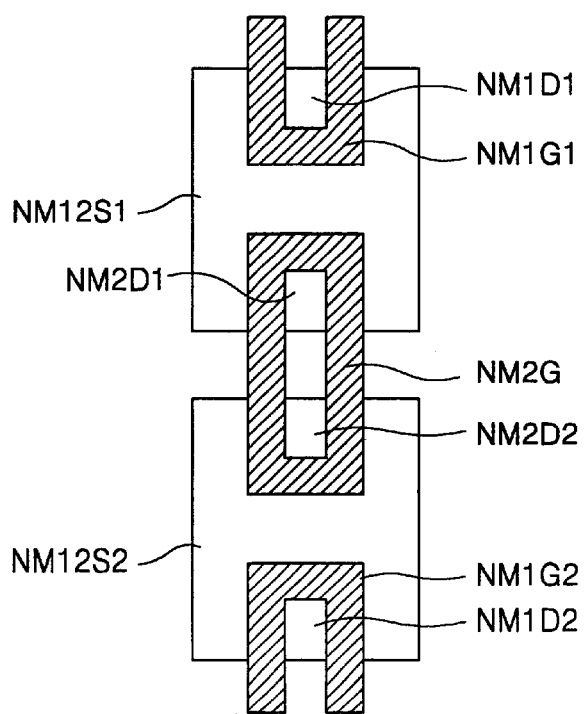

FIGS. 9A to 9E are plan views schematically illustrating a method of constructing the cross-coupled transistor pair of FIG. 5 according to a third embodiment of the invention. Referring to FIG. 9A, first and second active areas NM12A1, NM12A2 are separately arranged on upper and lower portions of a substrate (not shown). As shown in FIG. 9B, first, second, and third gate areas NM1G1, NM1G2, NM2G are arranged in a manner similar to that of the first, second, and third gate areas PM1G1, PM1G3, PM2G of the first embodiment, shown in FIG. 7B. First and second gate areas NM1G1, NM1G2 correspond to the first NMOS transistor NM1 (see FIG. 5). The third gate area NM2G corresponds to the second NMOS transistor NM2 (see FIG. 5).

Figure 9C:
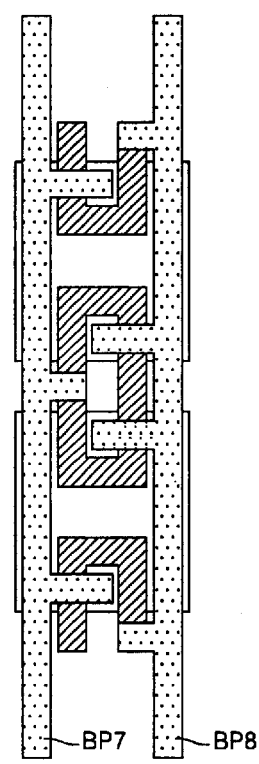

Referring to FIG. 9C, first and second signal lines BP7, BP8 are arranged in the same manner as the first and second signal lines BP5, BP6 of the second embodiment, shown in FIG. 8C. The first signal line BP7 is arranged to receive a bit line signal BL, and the second signal line BP8 is arranged to receive an inverted bit line signal BLB (see FIG. 5).

Figure 9D:
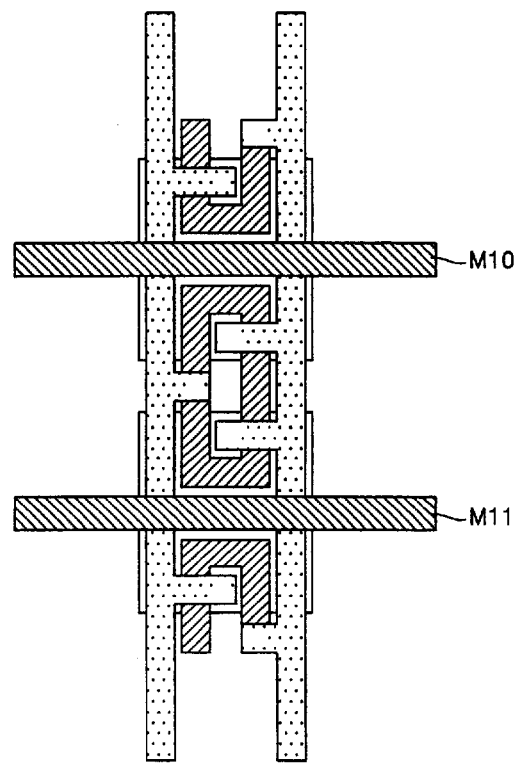

Referring now to FIG. 9D, a first metal line M10 is transversely disposed on a portion of the first common source area NM12S1 between the first and third gate areas NM1G1, NM2G. A second metal line M11 is transversely disposed on a portion of the second common source area NM12S2 between the second and third gate areas NM1G2, NM2G. The first and second metal lines M10, M11 apply a control signal LAB to the common source areas NM12S1, NM12S2.

Figure 9E:
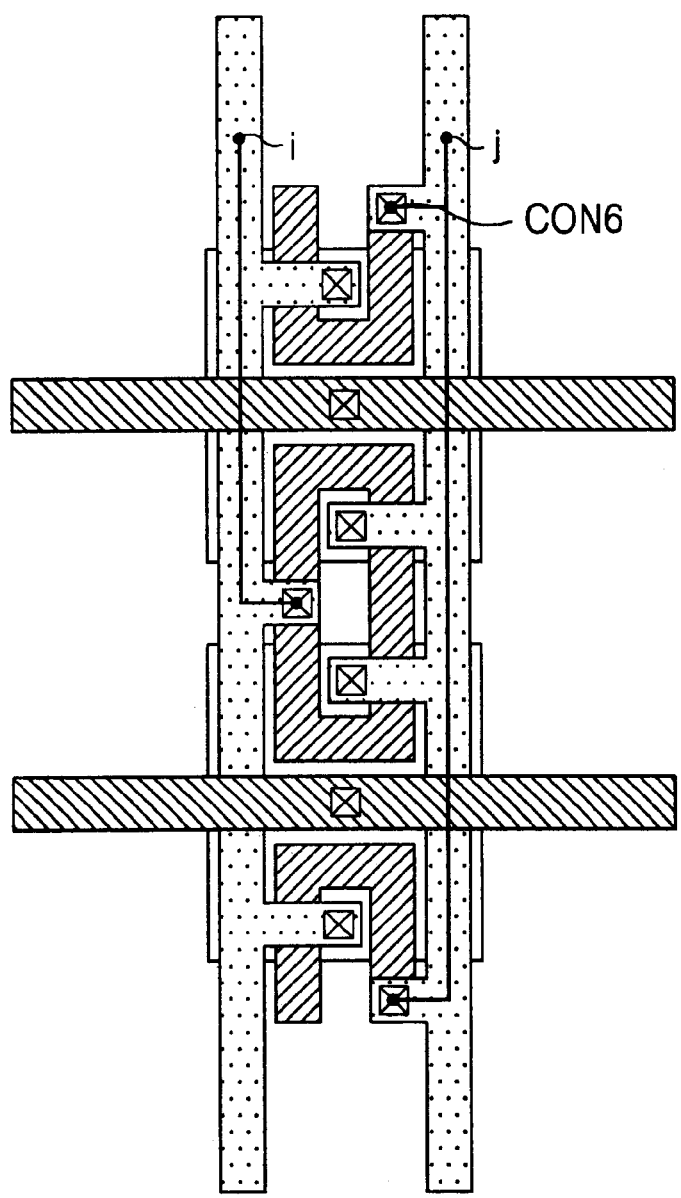

Finally, as shown in FIG. 9E, contacts CON6 are arranged to connect the first signal line BP7 to the first and second drain areas NM1D1, NM1D2 and the third gate area NM2G. Contacts CON6 also connect the second signal line BP8 to the third and fourth drain areas NM2D1, NM2D2 and to the first and second gate areas NM1G1, NM1G2. Similarly, the first metal line M10 is connected to the first common source area NM12S1, and the second metal line M11 is connected to the second common source area NM12S2.

Still referring to FIG. 9E, a distance from a node "i" to the third gate area NM2G, of the second NMOS transistor NM2, is equal to an average distance from a node "j" to the first and second gate areas NM1G1, NM1G2, of the first NMOS transistor NM1. As a result, the gate loading and the junction loading of the two transistors NM1, NM2 of the cross-coupled transistor pair are equal and the transistors can therefore operate as designed. In addition, compared with the layout shown in FIGS. 6A to 6E, the layout of this embodiment has a relatively small layout area.

As illustrated above, the present invention can be applied to different kinds of cross-coupled transistor pairs. Using the layout methods described above, even though a density of impurities implanted into gate areas of the two transistors forming the cross-coupled transistor pair varies from one gate area to the other, because an average value is adopted, the threshold voltages of the two transistors become equal, and the cross-coupled transistor pair can perform a stable and reliable operation.

The layout methods for constructing a cross-coupled transistor pair according to the various preferred embodiments of the present invention enable stable and reliable operation since the gate loading, the junction loading, and the threshold voltages of the transistors are equal. The layout methods according to preferred embodiments of the present invention are also advantageous because a layout area of the resulting cross-coupled transistor pair is relatively small.

While the invention has been particularly shown and described with reference to various preferred embodiments thereof, it will be understood by those skilled in the art that changes in form and detail may be made therein without departing from the principles of the invention. The invention should therefore be interpreted to incorporate any such modifications coming within the spirit or scope of the following claims.

What is claimed is:

1. A cross-coupled transistor pair, comprising:
 a first active area and a second active area, wherein the first and second active areas are arranged on opposite sides of an axis;
 a drain area of a first transistor arranged on a portion of the first and second active areas, wherein the drain area of the first transistor is symmetric about the axis;
 a gate area of the first transistor arranged on a portion of the first and second active areas that separates the drain area of the first transistor from a common source area on the first and the second active areas, wherein the gate area of the first transistor is symmetric about the axis;
 a drain area of a second transistor arranged on a portion of the first and second active areas, wherein the drain area of the second transistor is symmetric about the axis;
 a gate area of the second transistor arranged on a portion of the first and second active areas that separates the drain area of the second transistor from the common source area, wherein the gate area of the second transistor is symmetric about the axis;

a first signal line configured to connect the drain area of the first transistor and the gate area of the second transistor; and a second signal line configured to connect the drain area of the second transistor and the gate area of the first transistor.

2. A cross-coupled transistor pair according to claim 1, wherein the gate area of the second transistor is arranged between the gate area of the first transistor.

3. A cross-coupled transistor pair according to claim 2, wherein the gate area of the second transistor is arranged in a substantially rectangular or circular shape having a predetermined thickness.

4. A cross-coupled transistor pair according to claim 2, wherein the gate area of the first transistor that is arranged on a portion of the first active area is substantially shaped like the letter "U" and has a predetermined thickness.

5. A cross-coupled transistor pair according to claim 2, wherein the gate area of the first transistor that is arranged on a portion of the first active area is of a substantially semicircular shape and has a predetermined thickness.

6. A cross-coupled transistor pair according to claim 2, wherein an average distance from a signal applying node of the second signal line to the gate area of the first transistor is approximately equal to a distance from a signal applying node of the first signal line to the gate area of the second transistor.

7. A cross-coupled transistor pair according to claim 1, further comprising a metal line configured to supply a signal to the common source area on the first and second active areas.

8. A cross-coupled transistor pair according to claim 1, further comprising:

a first metal line disposed between the gate areas of the first and second transistors on the first active area to supply a control signal to the common source area on the first active area; and a second metal line disposed between the gate areas of the first and second transistors on the second active area to supply the control signal to the common source area on the second active area.

9. A cross-coupled transistor pair comprising:

a first active area and a second active area, wherein the first and second active areas are separate, non-contiguous, and symmetric to each other about an axis;

a first gate area and a first drain area arranged on a portion of the first active area, wherein the first gate area of the first transistor separates the first drain area from a first common source area arranged on a portion of the first active area;

a second gate area and a second drain area arranged on a portion of the second active area, wherein the second gate area separates the second drain area from a second common source area arranged on a portion of the second active area, wherein the second gate area is symmetric to the first gate area about the axis, and wherein the second drain area is symmetric to the first drain area about the axis;

a third gate area arranged symmetrically about the axis on a portion of the first active area and a portion of the second active area between the first and second gate areas, said third gate area further arranged to separate a third drain area on the first active area from the first common source area and to separate a fourth drain area on the second active area from the second common source area;

a first signal line configured to connect the third gate area to the first and second drain areas; and a second signal line configured to connect the first and second gate areas to the third and fourth drain areas, wherein the first gate area, second gate area, first drain area, and second drain area correspond to a first transistor and wherein the third gate area, third drain area, and fourth drain area correspond to a second transistor.

10. A cross-coupled transistor pair according to claim 9, further comprising:

a first metal line substantially perpendicular to the axis arranged on the first and second common source areas to one side of the first, second, and third gate areas, and a second metal line substantially perpendicular to the axis arranged on the first and second common source areas to another side of the first, second, and third gate areas.

11. A cross-coupled transistor pair according to claim 10, wherein said first and second metal lines are configured to supply a power supply voltage to the first and second common source areas.

12. A cross-coupled transistor pair according to claim 9, further comprising:

a first metal line substantially parallel to the axis arranged across the first active area between the first gate area and the third gate area; and a second metal line substantially parallel to the axis arranged across the second active area between the third gate area and the second gate area.

13. A cross-coupled transistor pair according to claim 12, wherein the first and second metal lines are arranged to supply a control signal to the first and second common source areas.

14. A cross-coupled transistor pair according to claim 9, wherein the first and second signal lines are arranged to receive a bit line pair.

* * * * *